United States Patent
Goto et al.

(10) Patent No.: US 6,781,358 B2
(45) Date of Patent: Aug. 24, 2004

(54) HALL-EFFECT CURRENT DETECTOR (75) Inventors: Hirokazu Goto, Tokyo (JP); Takashi Kato, Asaka (JP); Hiromichi Kumakura, Sitama-ken (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/188,504

(22) Filed: Jul. 2, 2002

(65) Prior Publication Data

US 2003/0006751 A1 Jan. 9, 2003

(30) Foreign Application Priority Data

Jul. 6, 2001 (JP) ........................................ 2001-206176

(51) Int. Cl.[7] ........................ G01R 19/00; G01R 33/07
(52) U.S. Cl. .................................. 324/117 H; 324/251
(58) Field of Search ........................ 324/117 H, 117 R, 324/127, 251, 252; 338/32 H; 327/511; 323/294; 257/425, E43.002

(56) References Cited

U.S. PATENT DOCUMENTS 5,041,780 A * 8/1991 Rippel .................... 324/117 H
5,694,103 A * 12/1997 Goodwin et al. ........... 336/178
6,184,679 B1 * 2/2001 Popovic et al. ............. 324/251
6,356,068 B1 * 3/2002 Steiner et al. .......... 324/117 H
6,462,531 B1 * 10/2002 Ohtsuka ................. 324/117 H
6,512,359 B1 * 1/2003 Tamai et al. ............ 324/117 R
6,515,468 B1 * 2/2003 Morimoto et al. ...... 324/117 H

FOREIGN PATENT DOCUMENTS

JP         2000-19199         1/2000

* cited by examiner

*Primary Examiner*—Ernest Karlsen
(74) *Attorney, Agent, or Firm*—Woodcock Washburn LLP (57) ABSTRACT

A current detector comprising a first and a second current-path detector each in the form of a sheet-metal punching having a pair of relatively broad terminal webs of rectangular shape joined together via a bridge of arcuate shape. The bridges are slender compared to the terminal webs for concentrated current flow therethrough. Various arrangements are possible for the two current-path conductors, but their bridges are invariably placed in superposition upon one another. A Hall generator is positioned between the bridges so as to be acted upon by magnetic fields created upon current flow therethrough. One of the terminal webs of the first current-path conductor is electrically connected to one terminal web of the second, in such a way that the magnetic lines of force due to current flow through the two bridges act in the same direction upon the Hall generator.

11 Claims, 10 Drawing Sheets

HALL-EFFECT CURRENT DETECTOR

BACKGROUND OF THE INVENTION

This invention relates to a current detector for detection or measurement of electric current flowing in an electric circuit, and more specifically to such a detector incorporating a Hall-effect device more generally known also as Hall generator.

The Hall generator is built upon the familiar Hall effect to develop a voltage, known as Hall voltage, in proportion to the strength of the magnetic field applied. Positioned contiguous to a path of electric current, the Hall generator will put out a voltage indicative of the magnitude of the current by being acted upon by the magnetic field appearing in proportion to the current magnitude.

A variety of suggestions have been made with Hall-effect current detectors to cause the magnetic field to act more effectively upon the Hall generator and hence to enhance the sensitivity of current detection. Japanese Unexamined Patent Publication No. 2000-19199 is hereby cited as teaching a current detector bearing particular pertinence to the instant invention. It suggests use of an arcuate current path around the Hall generator. The Hall generator can be subjected to a higher flux density with the arcuate current path than with the more conventional rectilinear current path, producing a higher Hall voltage for a given current magnitude. This prior art device has proved to admit of further improvement for still higher sensitivity.

SUMMARY OF THE INVENTION

The present invention aims at drastic enhancement of the sensitivity of the current detector of the kind defined, without making its construction unnecessary complex or expensive.

Briefly, the present invention may be summarized as a current detector utilizing the Hall-effect for detection or measurement of electric current. Included are a first and a second current-path conductor each comprising a pair of terminal webs and a bridge joining the pair of terminal webs. The two current-path conductors are so arranged relative to each other that the bridges thereof are superposed one upon the other with a spacing therebetween. A Hall generator is disposed in the spacing between the bridges of the first and the second current-path conductor so as to be acted upon by magnetic fields that are created upon current flow through the bridges. A coupling conductor interconnects one of the terminal webs of the first current-path conductor and one of the terminal webs of the second current-path conductor, in such a manner that magnetic lines of force due to current flow through the bridges of both current-path conductors act in the same direction on the Hall generator.

Preferably, each current-path conductor is a sheet-metal punching integrally comprising the pair of relatively broad terminal webs which are in side by side arrangement, and the bridge of substantially arcuate shape joining the pair of terminal webs. The arcuate bridge projects laterally of the pair of terminal webs and is constricted to cause concentrated current flow therethrough. The two current-path conductor are arranged in two parallel planes, with at least the bridges thereof superposed one upon the other. Disposed in the spacing between these bridges, the Hall generator is so positioned relative to the bridges as to be thereby surrounded, as seen in a direction normal to the planes of the current-path conductors, in order to be acted upon by magnetic fields that are created upon current flow through the bridges.

Thus, as the magnetic lines of force due to current flow through the bridges of both current-path conductors act in the same direction upon the Hall generator, the latter will be subjected to a flux density approximately twice as high as that to which it would be subjected if, as in the prior art, only one current-path conductor were provided. A material improvement in sensitivity is thus accomplished.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

General

FIGS. 1–10 of the above drawings are all directed to the first preferred form of current detector according to the invention. Pictured in its entirety in FIGS. 1–4, the representative current detector 1 broadly comprises a Hall generator assembly 2 including a Hall-effect device or Hall generator 14 and associated electronics, two current-path conductors 3 and 4 for carrying the current to be detected or measured, a coupling conductor 5 electrically interconnecting the current-path conductors 3 and 4, and a casing 6 in the form of a molding of rigid plastics material enveloping the Hall generator assembly 2 and some neighboring parts of the current-path conductors 3 and 4.

Figure 5:
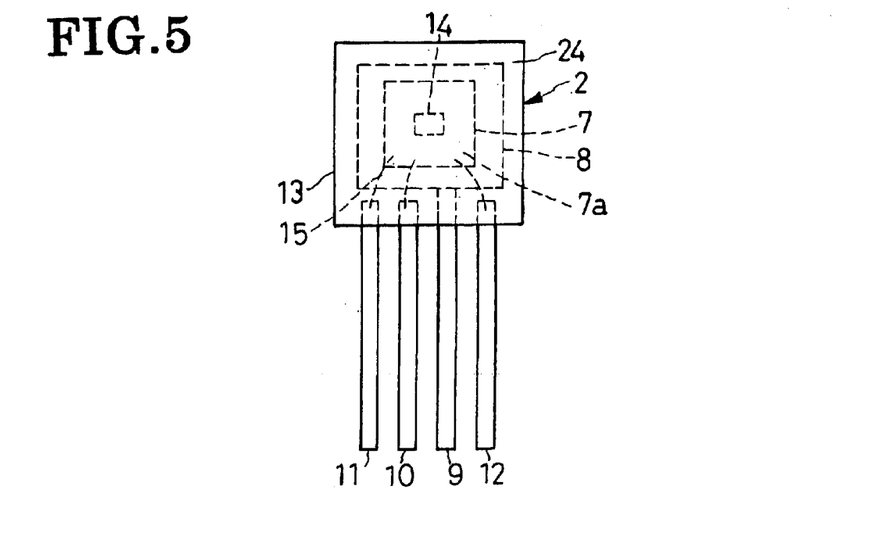
FIG. 5 is an enlarged plan view of the Hall generator assembly of the FIG. 1 current detector.
Figure 6:
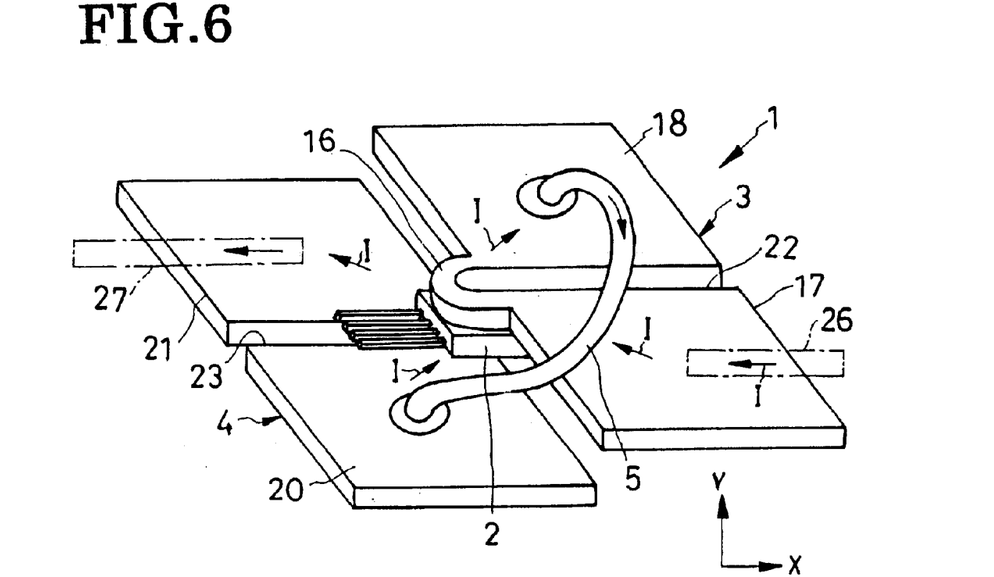
FIG. 6 is a perspective view of the FIG. 1 current detector without the casing.

The Hall generator assembly 2 is shown by itself in FIG. 5, and in combination with the current-path conductors 3 and 4 in FIG. 6. The Hall generator assembly 2, particularly the Hall generator 14, and the current-path conductor 3 and 4 are in prescribed positional relationship to each other as they are integrally united by the casing 6.

The first illustrated current detector 1 according to the invention will be set forth more specifically hereinbelow under the headings of "Hall Generator Assembly," "Current-Path Conductors" and "Operation," in that order.

Hall Generator Assembly

Figure 8:
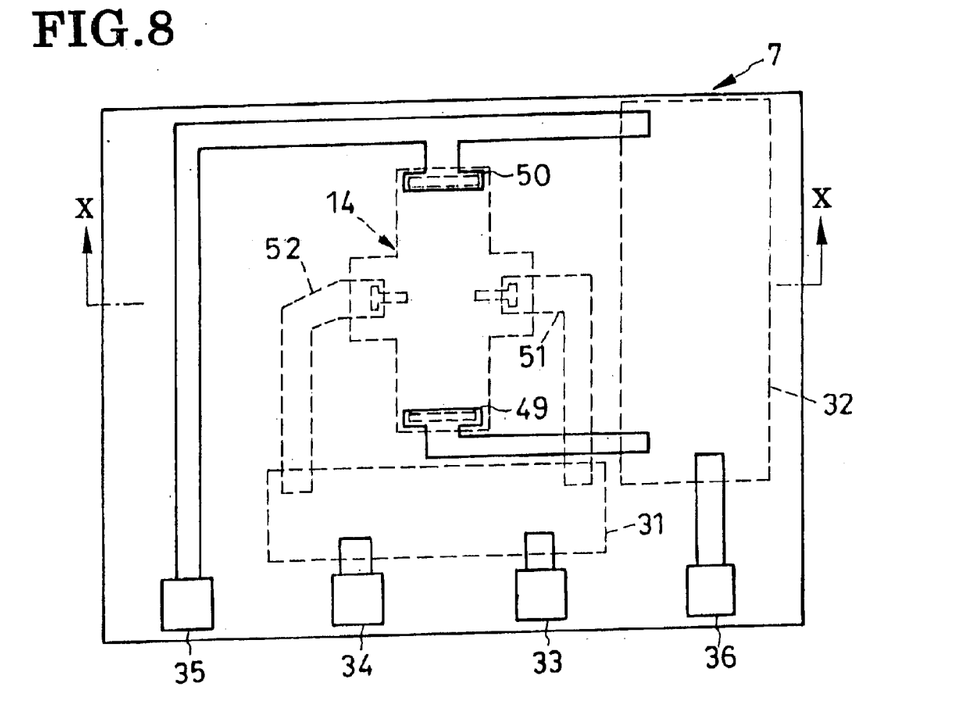
FIG. 8 is an enlarged plan view of the semiconductor substrate of the Hall generator assembly of the FIG. 1 current detector.
Figure 9:
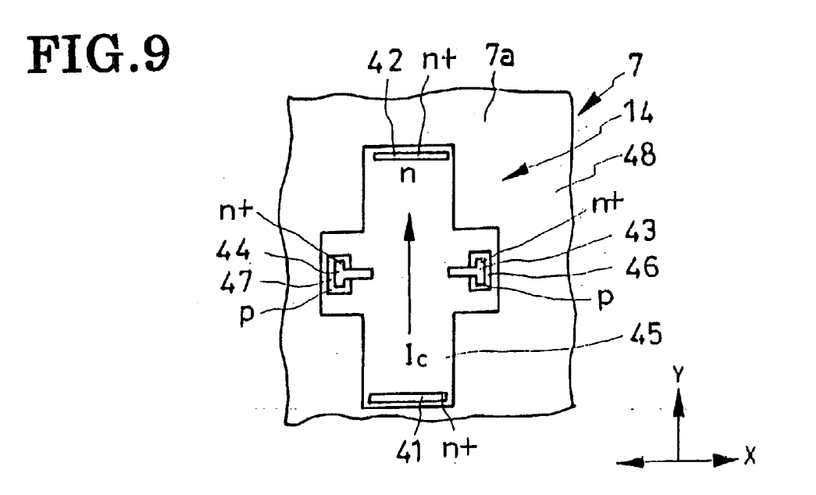
FIG. 9 is a still more enlarged, fragmentary plan view of the FIG. 8 semiconductor substrate, showing the Hall generator itself in particular.
Figure 10:
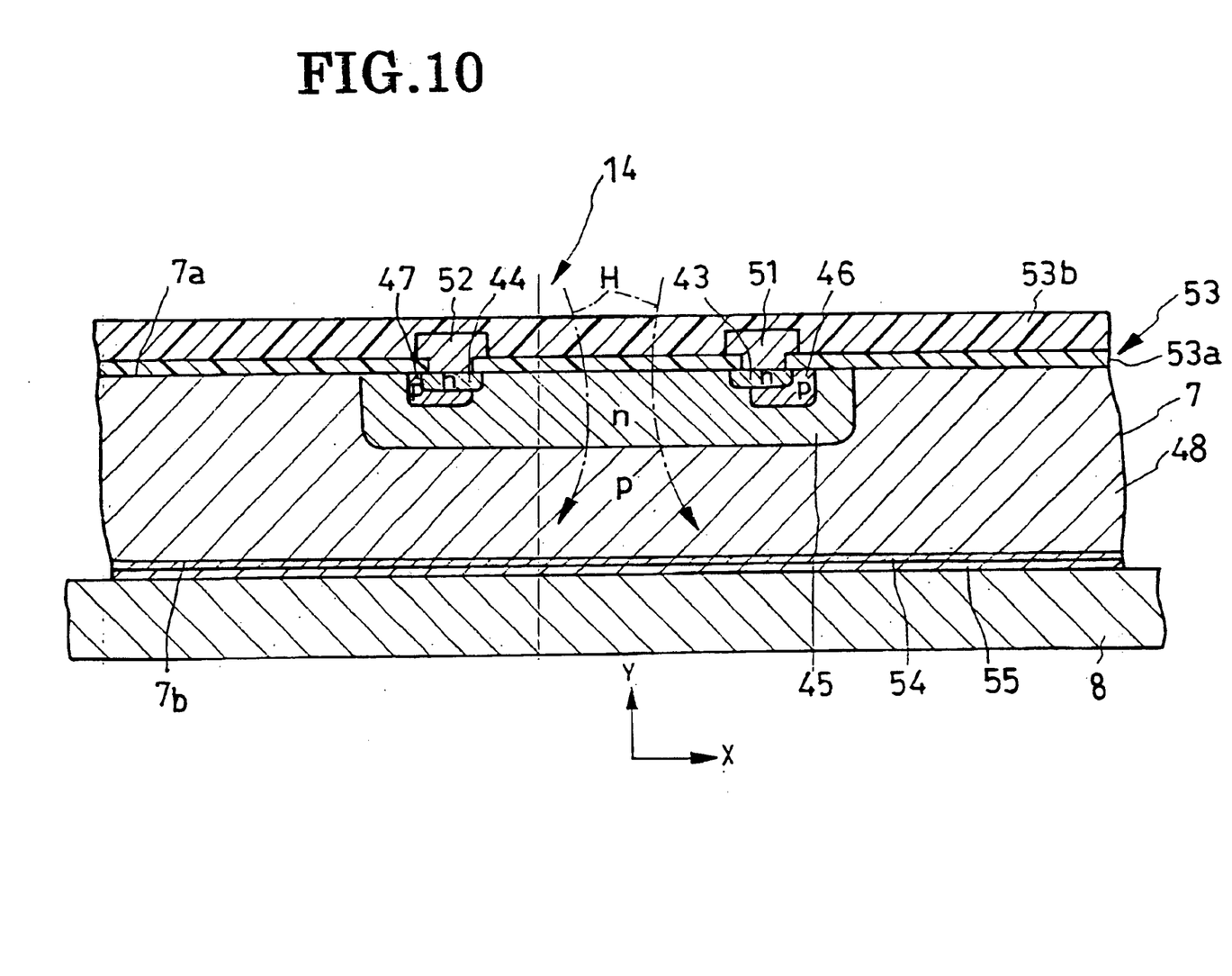
FIG. 10 is an even more enlarged, fragmentary section through the semiconductor substrate, taken along the line X—X in FIG. 8.

The Hall generator assembly 2 appears in FIGS. 1–6 and in part in FIGS. 8–10. It includes an integrated Hall generator circuit having a semiconductor substrate 7 having formed therein the Hall generator 14 and overlying a baseplate 8, perhaps as best revealed in FIG. 3–5. Additional components of the Hall generator assembly 2 include a set of leads 9, 10, 11 and 12 for connection of this current detector 1 to external circuitry, and a plastic encapsulation 13 enveloping all the listed components of the Hall generator assembly but most parts of the leads 9–12.

As illustrated on an enlarged scale in FIG. 8, the Hall generator 14 is formed in the semiconductor substrate 7 for generating a Hall voltage proportional to the magnitude of the current flowing through the current-path conductors 3 and 4. The substrate 7 is of any known or suitable semiconductor material such as gallium arsenide. This substrate has additionally formed therein an amplifier 31, a control current supply circuit 32, and four terminals 33, 34, 35 and 36. The construction of this semiconductor chip is generally conventional, so that no more detailed illustrations of the amplifier 31 and the control current supply circuit 32 are considered necessary; only, the Hall generator 14 is shown in further detail in FIGS. 9 and 10 as it bears more or less direct pertinence to the improvements that are introduced into this current detector by the instant invention.

With reference to both FIGS. 9 and 10 the Hall generator 14 is constituted of five n-type semiconductor regions 41, 42, 43, 44 and 45 and three p-type semiconductor regions 46, 47 and 48, which are all formed in the substrate 7 of rectangular shape as seen in a plan view as in FIG. 8. The fifth n-type semiconductor region 45 is formed as an island, which is cross-shaped as seen in a plan view as in FIG. 9, in the third p-type semiconductor region 48 which occupies most part of the substrate 6. Higher in impurity concentration than this fifth n-type semiconductor region 45, the first and second n-type semiconductor regions 41 and 42 are both formed as islands in the region 45 with a spacing therebetween along the y-axis indicated in FIG. 9.

Referring temporarily back to FIG. 8, electrodes 49 and 50 are in ohmic contact respectively with the first and second n-type semiconductor regions 41 and 42. The electrodes 49 and 50 are both connected to the control current supply circuit 32 in order to cause control current $I_c$, FIG. 9, to flow through the fifth n-type semiconductor region 45 from the first n-type semiconductor region 41 to the second n-type semiconductor region 42. It is understood that the electrodes 49 and 50 are electrically connected via the control current supply circuit 32 to the pair of terminals 35 and 36, FIG. 8, thereby to be coupled to a direct current power supply, not shown.

With reference to FIGS. 9 and 10 again, the third and fourth n-type semiconductor regions 43 and 44, which are also higher in impurity concentration than the fifth n-type semiconductor region 45, are formed adjacent the center of the fifth n-type semiconductor region in the direction of the y-axis and spaced from each other in the direction of the x-axis for detection of the Hall voltage. These regions 43 and 44 are partly contiguous to the fifth n-type semiconductor region 45 and partly to the first and second p-type semiconductor regions 46 and 47. These p-type semiconductor regions 46 and 47 are intended to limit the areas of contact of the third and fourth n-type semiconductor regions 43 and 44 with the fifth n-type semiconductor region 45. Both FIGS. 8 and 10 indicate that electrodes 51 and 52 are in ohmic contact with the third and fourth n-type semiconductor regions 43 and 44. The electrodes 51 and 52 are electrically coupled to the terminals 33 and 34, respectively, via the amplifier 31.

A Hall voltage will develop between the third and fourth n-type semiconductor regions 43 and 44 in proportion to the strength of the magnetic field applied normal to the flow of the control current JC from the first n-type semiconductor region 41 to the second n-type semiconductor region 42 as in FIG. 9. Thus the part of the fifth n-type semiconductor region 45 which lies between the first and second n-type semiconductor regions 41 and 42 and between the third and fourth n-type semiconductor regions 43 and 44 constitutes the primary working part of the Hall generator 13 where the Hall voltage is generated, in the narrower sense of the term. Speaking more broadly, however, this term may be construed to refer to the entire fifth n-type semiconductor region 45.

FIG. 10 best indicates that the semiconductor substrate 7 has an insulating layer 53, as of silicon oxide, formed on one major surface $7_a$ thereof and a metallic layer 54, as of aluminum, on the other major surface $7_b$ thereof. The insulating layer 53 takes the form of a lamination of two sublayers 53a and 53b for convenience in wiring. The electrodes 49 and 50, FIG. 8, are coupled to the first and second n-type semiconductor regions 41 and 42, respectively, via openings in these insulating sublayers 53a and 53b. The electrodes 51 and 52, FIG. 8, are coupled to the third and fourth n-type semiconductor regions 43 and 44, respectively, via openings in the insulating sublayer 53a. The metallic layer 54 on the other major surface $7_b$ of the substrate 7 is bonded at 55 to the mounting plate 8 shown also in FIGS. 3–5. The bonding agent 55 may be either electrically conductive or insulating.

FIG. 5 best indicates that the mounting plate 8 is generally rectangular in shape, with an area greater than that of the overlying semiconductor substrate 7. The mounting plate 8 and the four leads 9–12 are punchings made from the same sheet metal material such as sheet copper with a nickel plating. The mounting plate 8 is joined directly to the lead 9 and electrically coupled to the terminal 33, FIG. 8. The other leads 10–12 are connected to the terminals 34–36 via the wires 15, respectively. The leads 9 and 10 are for putting out the Hall voltage, and the leads 11 and 12 for supplying the control current $I_C$ to the Hall generator 14.

Current-Path Conductors

With reference to FIGS. 1–4, 6 and 7 the current-path conductors 3 and 4 provide, combination with the coupling conductor 5, a path for the current to be detected by the Hall generator assembly 2. Preferably, the current-path conductors 3 and 4 are both punchings of sheet copper, complete with a nickel plating, that is sufficiently thick to carry current of, say, 100 amperes or so.

As best pictured in FIGS. 6, the current-path conductor 3 has a pair of relatively broad terminal webs 17 and 18 of rectangular, or approximately square, a relatively slender bridge 16 of arcuate shape joining the pair of terminal webs 17 and 18 each at one corner thereof. The bridge 16 is arched through an angle of approximately 180 degrees in this particular embodiment of the invention. The pair of terminal webs 17 and 18 are coplanar with each other, and with the bridge 16, and aligned with each other with a space or slit 22 therebetween. This slit 22 is closed at one end by the bridge 16 which projects laterally from the two aligned edges of the terminal webs 17 and 18. The bridge 16 is very slender compared to the pair of terminal webs 17 and 18 in order to cause concentrated current flow through the bridge.

Figure 7:
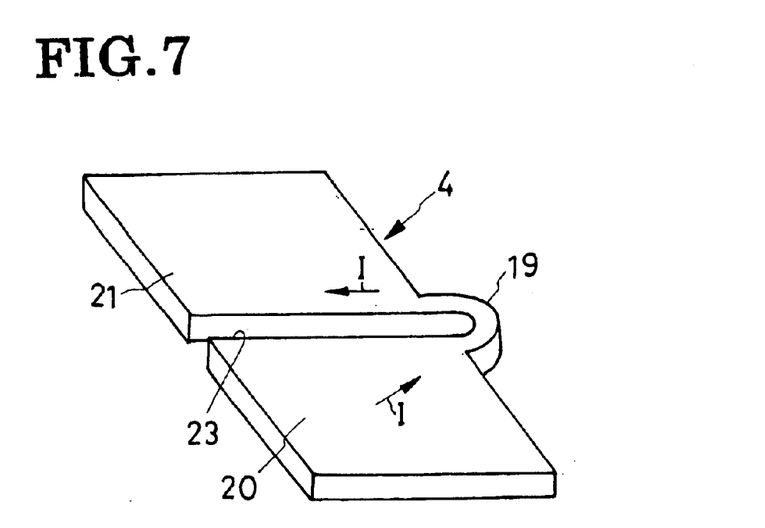
FIG. 7 is a perspective view of the second current-path conductor which is not fully revealed in FIG. 6.

A study of FIGS. 6 and 7 will reveal that the other current-path conductor 4 is of like shape, comprising a pair of broad terminal webs 20 and 21 of rectangular shape, and a slender bridge 19 of arcuate shape integrally joining the terminal webs. The pair of terminal webs 17 and 18 are aligned with each other, and with the bridge 19, via an intervening slit 23 extending into the bridge.

The pair of planar current-path conductors 3 and 4 are arranged in two parallel planes, with their bridges 16 and 19 directed toward each other and disposed in superposition. The Hall generator assembly 2 is engaged between these superposed bridges 16 and 19 of the current-path conductors 3 and 4, with the bridge 16 on the side of the first major surface 7a, FIG. 10, of the semiconductor substrate 7 and with the other bridge 19 on the side of the second major surface $7_b$ of the semiconductor substrate. More specifically, as indicated in both FIGS. 3 and 4, the bridge 16 of the first current-path conductor 3 is held against the surface 24 of the encapsulation 13 of the Hall generator assembly 2. The bridge 19 of the second current-path conductor 4 is held against the opposite surface 25 of the Hall generator assembly encapsulation 13. The encapsulation surfaces 24 and 25 are both parallel to the major surfaces $7_a$ and $7_b$ of the semiconductor substrate 7.

Figure 1:
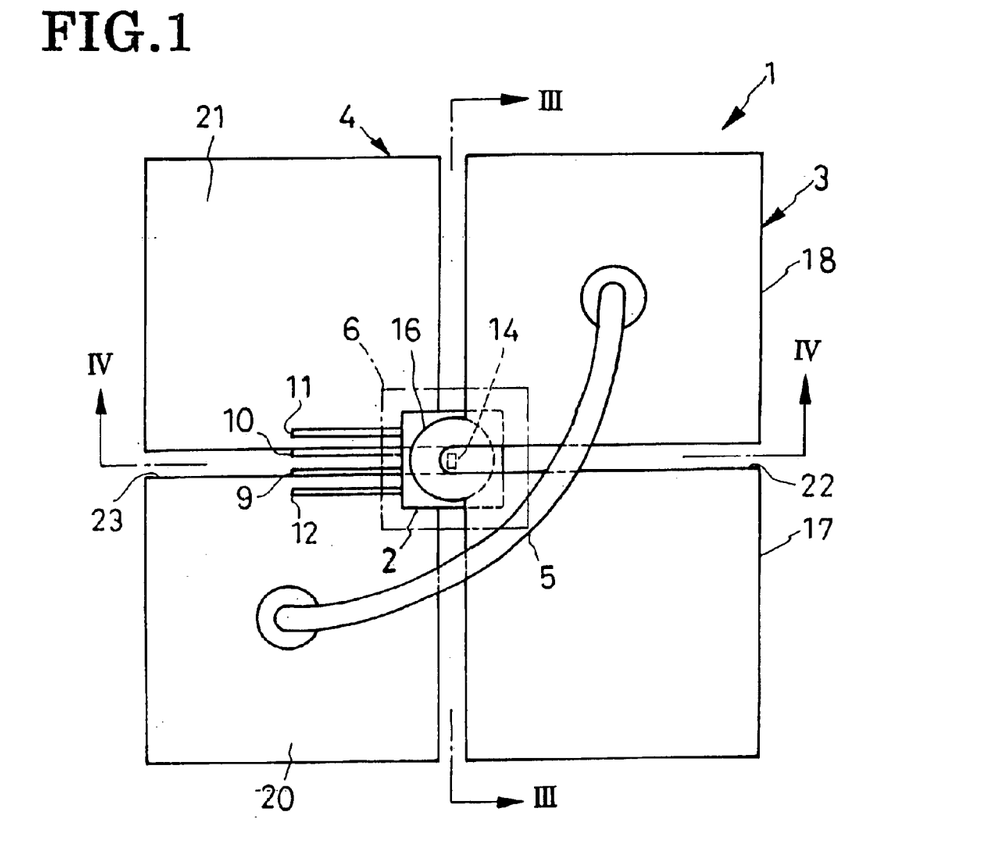
FIG. 1 is a plan view of a first preferred form of current detector according to the present invention, the view showing the casing in phantom outline to reveal other parts of the current detector.
Figure 2:
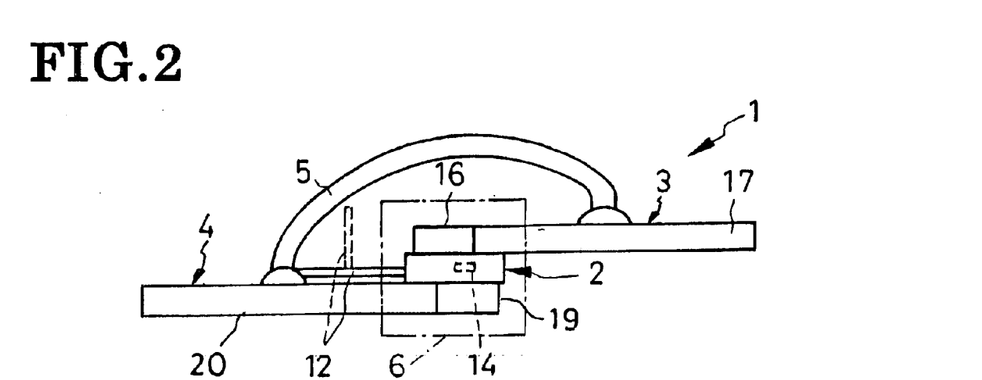
FIG. 2 is a side elevation of the showing of FIG. 1.

As seen in a plan view as in FIG. 1, or in a direction perpendicular to the parallel planes of the current-path conductors 3 and 4, the two arcuate bridges 16 and 19 as a whole are in annular arrangement, with the Hall generator 14 at the center of the ring. The Hall generator 14 has approximately three quarters of its periphery surrounded by each of the bridges 16 and 19.

The coupling conductor 5 is a length of wire having one end coupled, both mechanically and electrically, to the terminal web 18 of the first current-path conductor 3 approximately at its geometric center, and the other end to the terminal web 20 of the second current-path conductor 4 approximately at its center. The two diagonally opposite terminal webs 18 and 20 of the current-path conductors 3 and 4 are thus directly coupled together for the flow therebetween of the current to be detected or measured.

Arranged as above, the Hall generator assembly 2 and the two current-path conductors 3 and 4 are positively held together by the casing 6 which in practice may take the form of an epoxy resin molding. The casing 6 envelopes all but parts of the leads 9–12 of the Hall generator assembly 2, and all of the bridges 16 and 19 of the current-path conductors 3 and 4, leaving exposed most parts of the current-path conductor webs 17, 18, 20 and 21 and all of the coupling conductor 5.

Operation

In use of this current detector 1, constructed as set forth hereinbefore with reference to FIGS. 1–10, the pair of terminals 26 and 27, FIG. 6, of the desired electric circuit to be tested may be connected respectively to the first terminal web 17 of the first current-path conductor 3 and to the second terminal web 21 of the second current-path conductor 4. Thereupon, as indicated by the arrows in FIG. 6, the current I will flow through the first current-path conductor first terminal web 17, the first current-path conductor bridge 16, the first current-path conductor second terminal web 18, the coupling conductor 5, the second current-path conductor first terminal web 20, the second current-path conductor bridge 19, and the second current-path conductor second terminal web 21, in that order.

With the current flow through the current-path conductor bridges 16 and 19, magnetic fields will be created according to Fleming's right-hand rule, with the magnetic lines of force crossing the major surfaces of the Hall generator 14. This Hall generator will then produce a Hall voltage proportional to the flux density. It will be appreciated that the currents flowing through the current-path conductor bridges 16 and 19 give rise to magnetic lines that are all oriented in the same direction across the Hall generator 14. The density of the magnetic flux thus acting on the Hall generator 14 will be twice as high as if only either of the two current-path conductors 3 and 4 were provided.

It will also be recalled that each of the current-path conductor bridges 16 and 19 are curved to surround approximately three quarters of the periphery of the Hall generator 14, as seen in a plan view as in FIG. 1. These bridges 16 and 19 are, moreover, each very much constricted in comparison with the broad webs 17 and 18, or 20 and 21, for concentrated current flow through the bridges. These additional features of the invention also contribute materially to the enhancement of the sensitivity of this current detector 1. This greatly enhanced sensitivity will be maintained throughout the expected lifetime of the current detector as the noted working components are integrally enveloped in the molded epoxy casing 6 and thereby positively held together in the prescribed positional relationship.

Figure 11:
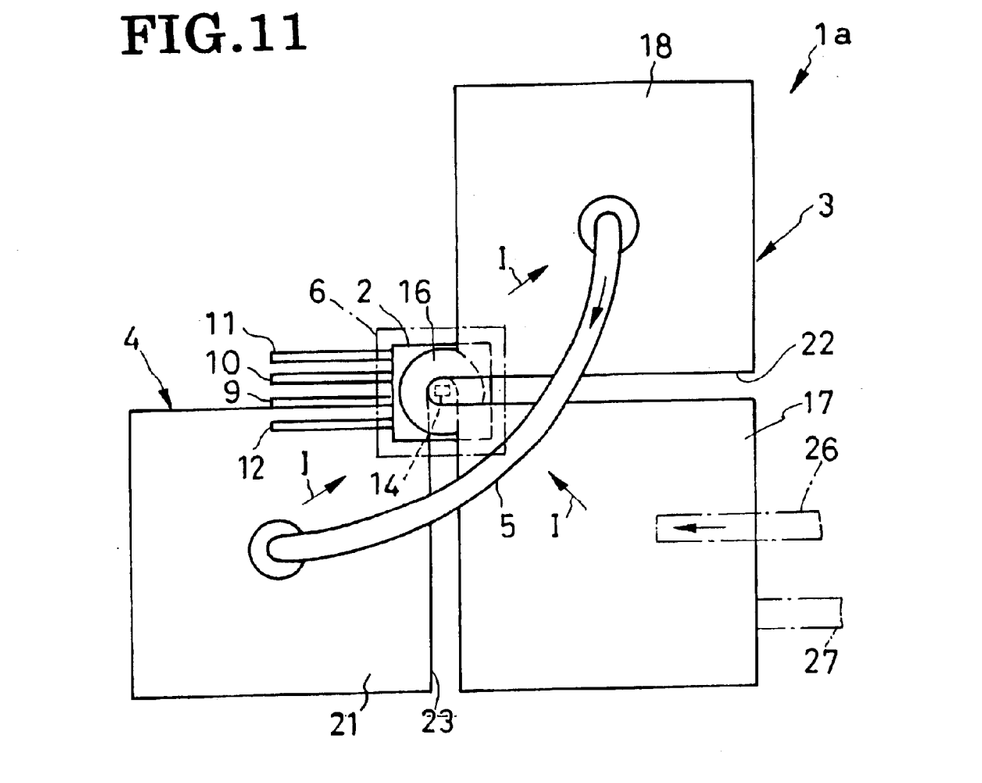
FIG. 11 is a view similar to FIG. 1 but showing a second preferred form of current detector according to the present invention.
Figure 12:
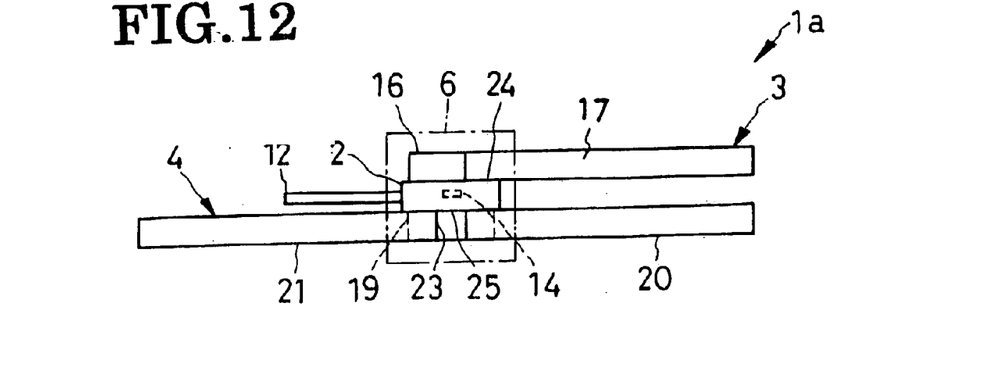
FIG. 12 is a side elevation of the showing of FIG. 1.
Figure 13:
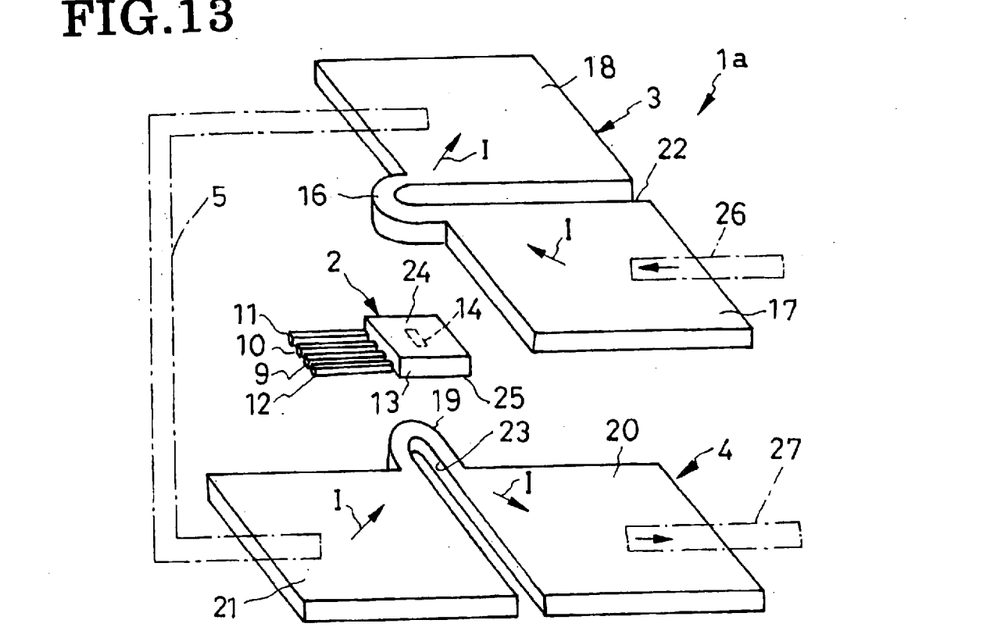
FIG. 13 is an exploded perspective view of the FIG. 11 current detector.

Embodiment of FIGS. 11–13

This second preferred form of current detector $1_a$ is similar to the FIGS. 1–10 embodiment in having the two current-path conductors 3 and 4 but differs therefrom in the arrangement of these conductors. The two current-path conductors 3 and 4 are not parallel to each other as in the previous embodiment but at right angles, with the terminal web 17 of the first current-path conductor 3 superposed upon, or in register with, the terminal web 20 of the second current-path conductor 4. The second current-path conductor 4 is turned 90 degrees, in its own plane which is parallel to that of the first current-path conductor 3, about the Hall generator 14.

As the two current-path conductors 3 and 4 are angularly displaced 90 degrees from each other, so, of course, are their arcuate bridges 16 and 19. The Hall generator 14 lies at the center of the ring delineated by the two bridges 16 and 19, as seen in a plan view as in FIG. 11. The coupling conductor 5 connects the second terminal web 18 of the first current-path conductor 3 to the second terminal web 21 of the second current-path conductor 4. All the other details of construction are as set forth above in conjunction with the FIGS. 1–10 current detector 1.

In use of this current detector $1_a$ the pair of terminals 26 and 27 of the electric circuit to be tested may be connected respectively to the first terminal web 17 of the first current-path conductor 3 and to the first terminal web 20 of the second current-path conductor 4. As indicated by the arrows in FIG. 13, the current I to be detected or measured will then flow through the first current-path conductor first terminal web 17, the first current-path conductor bridge 16, the first current-path conductor second terminal web 18, the coupling conductor 5, the second current-path conductor second terminal web 21, the second current-path conductor bridge 19, and the second current-path conductor first terminal web 20, in that order. The direction of current flow could be the other way around, though.

In this alternate embodiment, too, the two constricted arcuate bridges 16 and 19 of the current-path conductors 3 and 4 are closely held against the Hall generator 14 from its opposite sides, conjointly surrounding the same as seen in a plan view as in FIG. 11. The current detector $1_a$ will be just as high in sensitivity as the first disclosed current detector 1.

Figure 14:
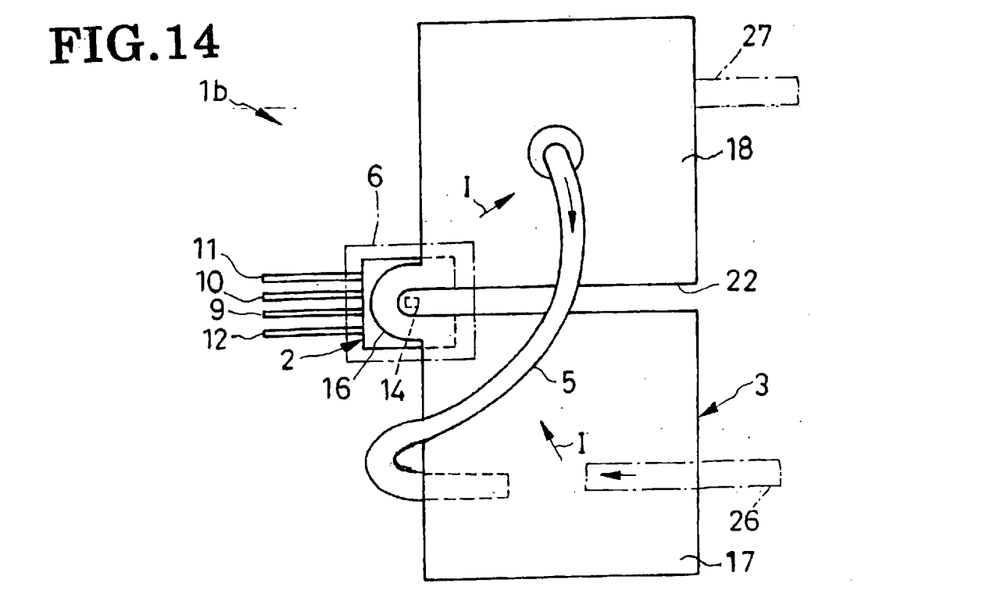
FIG. 14 is a view similar to FIG. 1 but showing a third preferred form of current detector according to the present invention.
Figure 15:
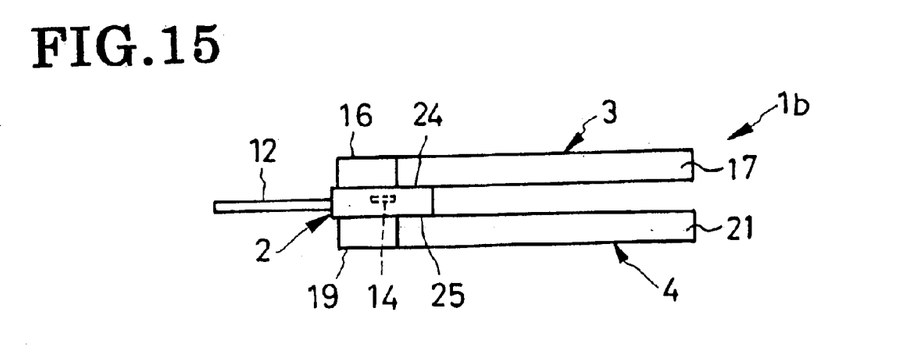
FIG. 15 is a side elevation of the FIG. 14 current detector, the view not showing the coupling conductor.
Figure 16:
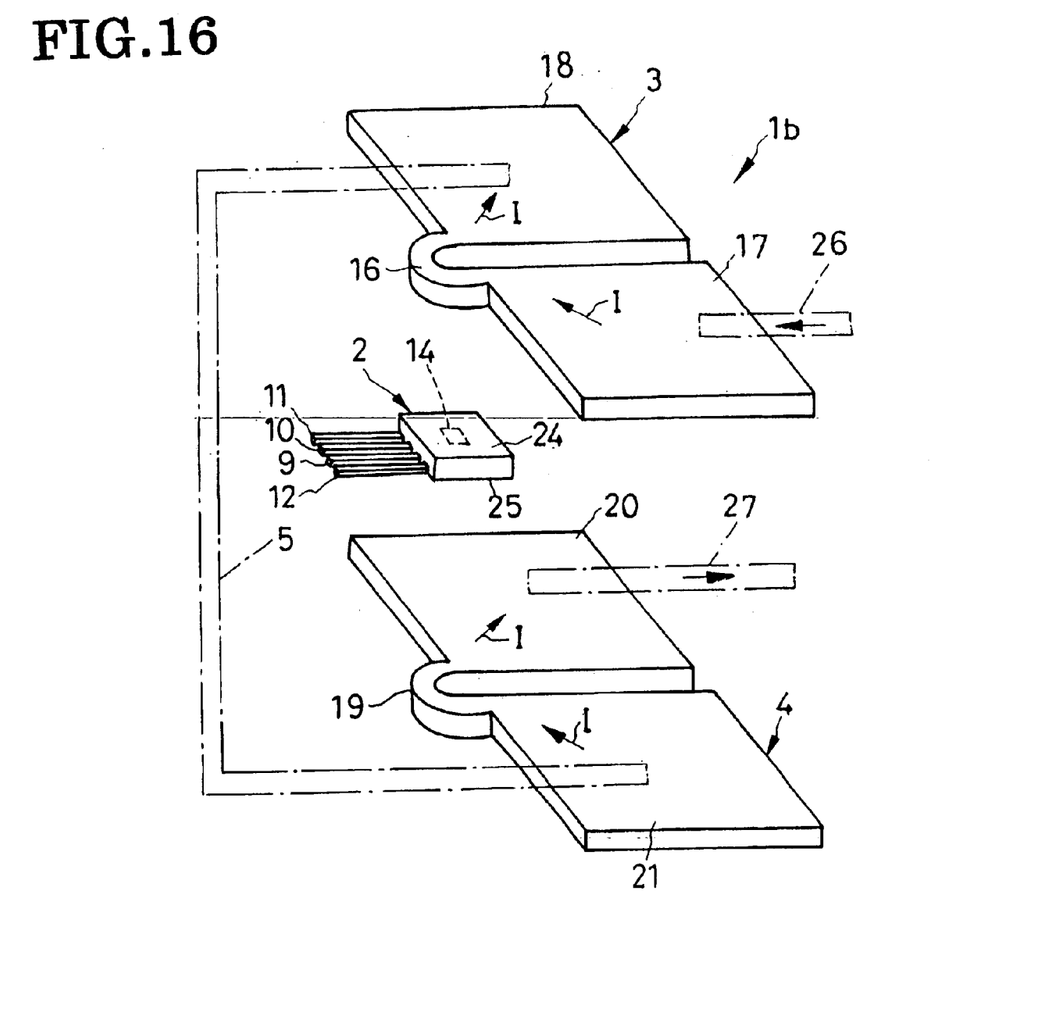
FIG. 16 is an exploded perspective view of the FIG. 14 current detector.

Embodiment of FIGS. 14–16

The two current-path conductors 3 and 4 may be wholly placed one on top of the other, as in the current detector $1_b$ shown in FIGS. 14–16. The bridges 16 and 19 of the superposed conductors 3 and 4 extend in the same direction therefrom and so are themselves in superposition. The Hall generator assembly 2 is caught between the current-path conductors 3 and 4, with the Hall generator 14 disposed interiorly of the current-path conductor bridges 16 and 19, as seen in a plan view as in FIG. 14, and with the set of leads 9–12 extending in a direction away from the current-path conductors. As indicated in phantom outline in FIG. 16, the coupling conductor 5 connects the second terminal web 18 of the first current-path conductor 3 to the second terminal web 21 of the second current-path conductor 4. All the other details of construction are as disclosed in reference to the FIGS. 1–10 current detector 1.

FIG. 16 is also explanatory of a mode of use of this current detector $1_b$. The pair of terminals 26 and 27 of the circuit to be tested are shown connected respectively to the first terminal web 17 of the first current-path conductor 3 and to the first terminal web 20 of the second current-path conductor 4. The electric current I is shown to flow the first current-path conductor first terminal web 17, the first current-path conductor bridge 16, the first current-path conductor second terminal web 18, the coupling conductor 5, the second current-path conductor second terminal web 21, the second current-path conductor bridge 19, and the second current-path conductor first terminal web 20, in that order. The direction of current flow could be reversed.

The bridges 16 and 19 of the two current-path conductors 3 and 4 are closely held against the opposite sides of the Hall generator assembly 2. The Hall generator 14 is itself positioned interiorly of the bridges 16 and 19, as seen in a plan view as in FIG. 14, and has approximately three quarters of its periphery surrounded by both bridges. Thus the current detector $1_b$ also gains substantially the same advantages as its FIGS. 1–10 counterpart 1.

Figure 17:
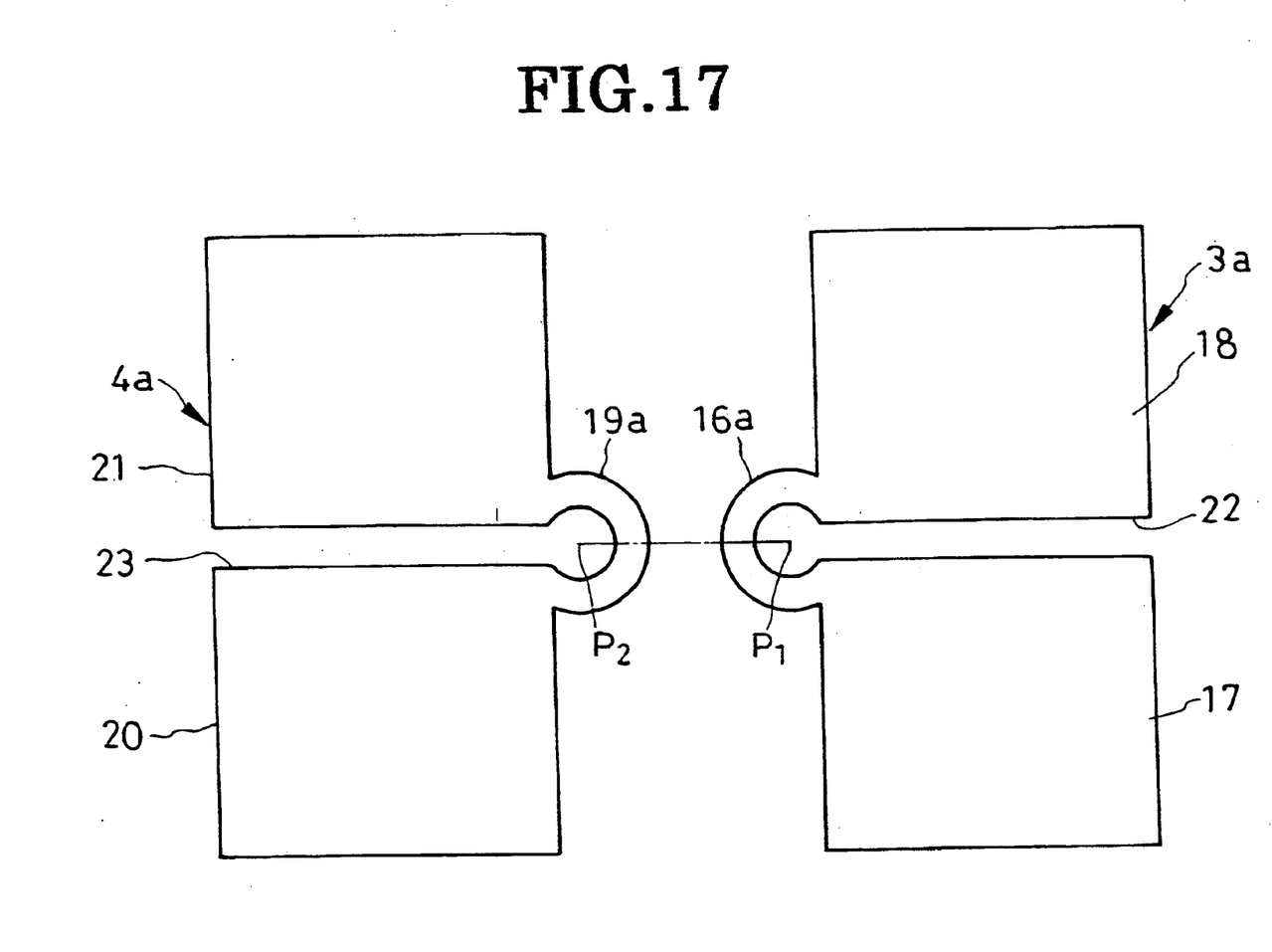
FIG. 17 is a plan view of a modified pair of current-path conductors according to the present invention.

Embodiment of FIG. 17

The two current-path conductors 3 and 4 used in all the foregoing embodiments of the invention may be modified as shown in FIG. 17 and therein generally designated $3_a$ and $4_a$. The modified current-path conductors $3_a$ and $4_a$ features bridges $16_a$ and $19_a$ that are each arched through an angle of well over 180 degrees, in contrast to the bridges 16 and 19 of the current-path conductors 3 and 4 which are arched through approximately 180 degrees. The current-path conductors $3_a$ and $4_a$ are similar in all the other details of construction to their FIGS. 1–10 counterparts 3 and 4, and are for use with the Hall generator assembly, not shown in FIG. 17, of the same construction as in FIGS. 1–10.

The modified current-path conductors $3_a$ and $4_a$ are to be put to use in the same manner as their FIGS. 1–10 counterparts 3 and 4 are; that is, the conductors $3_a$ and $4_a$ are arranged parallel to each other, with their own planes slightly offset one from the other, and with the centers $P_1$ and $P_2$ of the quasi-annular bridges 16a and 19a in alignment with each other. The Hall generator assembly 2 is inserted between the bridges $16_a$ and $19_a$, with the Hall generator 14 in register with the bridge centers $P_1$ and $P_2$. The Hall generator assembly 2 and the current-path conductors $3_a$ and $4_a$ are held together by an epoxy molding or the like as in the foregoing embodiments. As seen in a direction normal to the planes of the current-path conductors $3_a$ and $4_a$, the Hall generator 14 is nearly wholly surrounded by the quasi-annular bridges $16_a$ and $19_a$. Thus the FIG. 17 current detector gains the same advantages as that of FIGS. 1–10.

The current-path conductors $3_a$ and $4_a$ need not necessarily be arranged parallel to each other as in FIGS. 1–10. Other arrangements, set forth for the current-path conductors 3 and 4, are possible. The current-path conductors $3_a$ and $4_a$ may therefore be disposed either at right angles with each other, as in FIGS. 11–13, or in complete superposition as in FIGS. 14–16.

Figure 18:
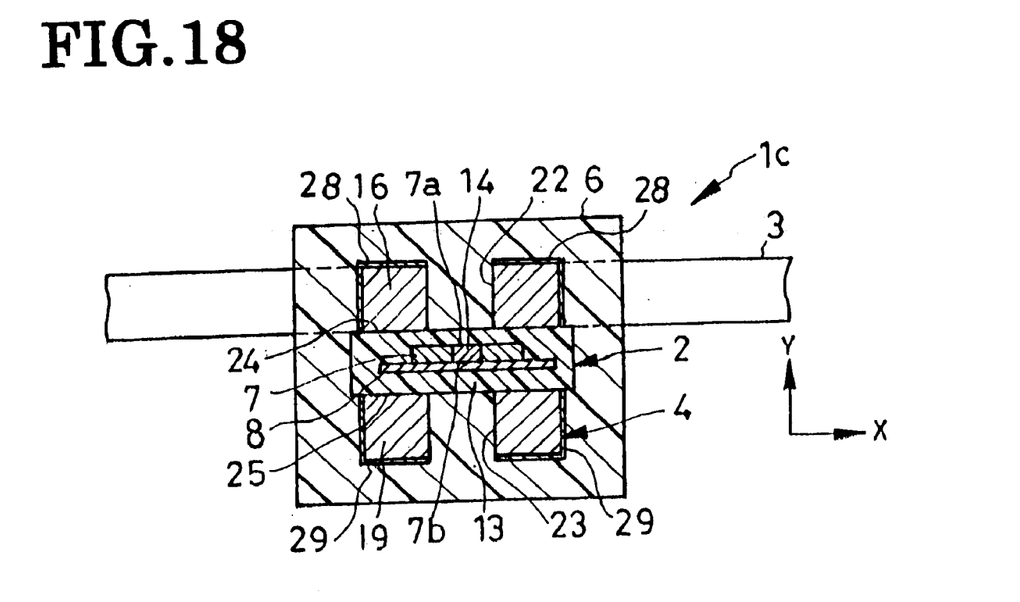
FIG. 18 is a view similar to FIG. 3 but showing a further preferred form of current detector according to the present invention.
Figure 19:
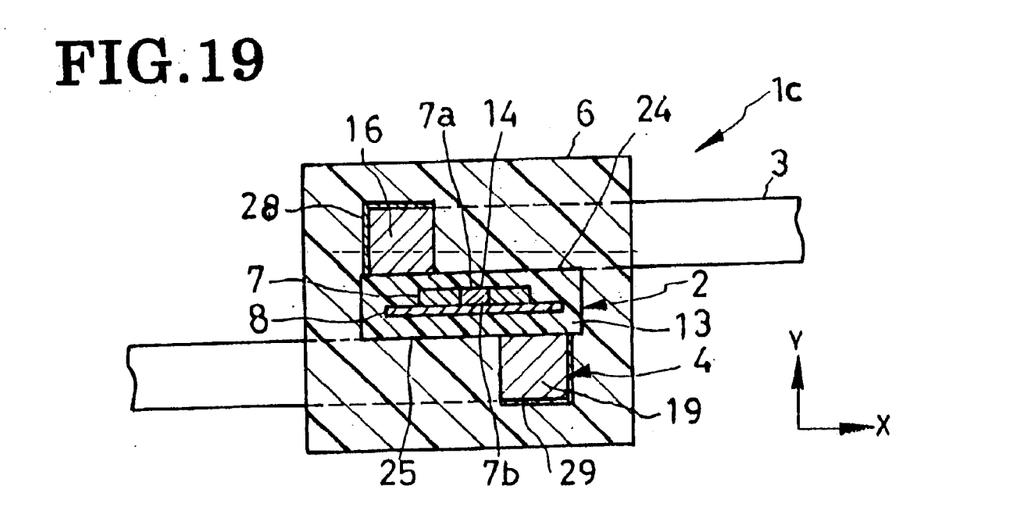
FIG. 19 is a view similar to FIG. 4 but showing the FIG. 18 current detector.

Embodiment of FIGS. 18–19

Figure 3:
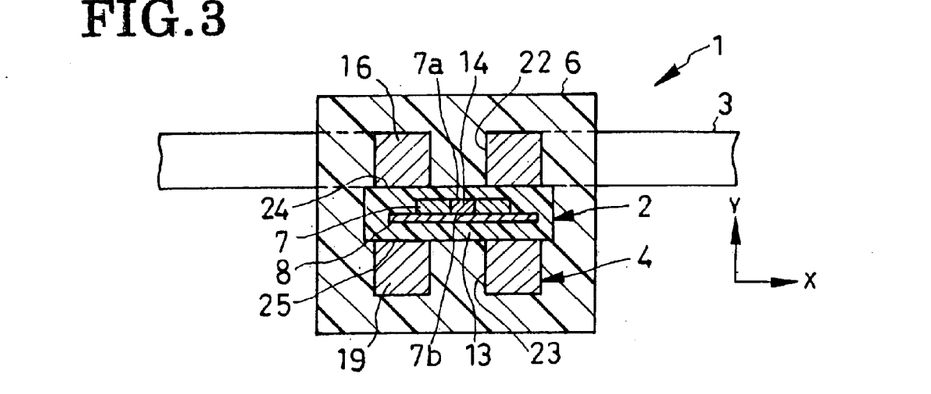
FIG. 3 is an enlarged section, with parts shown broken away for illustrative convenience, through the first preferred form of current detector, taken along the line III—III in FIG. 1.
Figure 4:
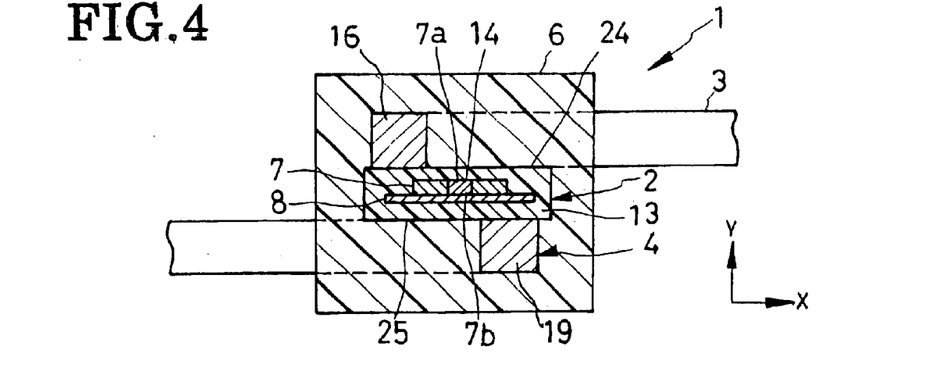
FIG. 4 is also an enlarged section, with parts shown broken away for illustrative convenience, through the first preferred form of current detector, taken along the line IV—IV in FIG. 1.

In a further preferred form of current detector $1_a$ shown in FIGS. 18–19 in sections similar to the FIGS. 3–4 sections of the first disclosed current detector 1, overlays 28 and 29 of magnetic material cover parts of the arcuate bridges 16 and 19 of the current-path conductors 3 and 4. A currently preferred material of the magnetic overlays 28 and 29 is Permalloy (tradename for any of several highly magnetically permeable iron-base alloys containing about 35–80 percent nickel). All the other details of construction are as described above with reference to FIGS. 1–10.

A closer study of FIGS. 18–19 will reveal that the magnetic overlays 28 and 29 overlie those surfaces of the current-path conductor bridges 16 and 19 which face away from the Hall generator 14. Such magnetic overlays may be formed by any known or suitable method such as plating, vapor deposition, or the bonding of preformed sheets. The magnetic overlays 28 and 29 are designed to enhance the sensitivity of the current detector by preventing the magnetic fluxes from unnecessarily spreading. The same objective could be achieved, however, by covering part of only either of the current-path conductor bridges 16 and 19 with a magnetic overlay.

Possible Modifications

Although the current detector according to the invention has been shown and described hereinbefore in terms of several preferred forms thereof, it is not desired that the present invention be limited by the exact details of the drawings or by the description thereof. The following is a brief list of possible modifications and alterations of the illustrated embodiments which are all believed to fall within the scope of this invention:

1. The semiconductor substrate 7 could have only the Hall generator 14 formed therein.
2. The two current-path conductors 3 and 4, or 3$_a$ and 4$_a$, could be in other than the various arrangements adopted in the illustrated embodiments of the invention, provided that the bridges 16 and 19, or 16$_a$ and 19$_a$, are more or less closely positioned on opposite sides of the Hall generator.
3. The bridges 16 and 19 could be U-shaped, rather than arcuate or quasi-annular.
4. The coupling conductor 6 could be enveloped, either in part or in whole, in the casing 6.
5. The leads 9–12 of the Hall generator assembly 2 could be bent as indicated by the broken lines in FIG. 2, for ease of connection to external circuitry.
6. The casing 6 could be enclosed in a magnetic overlay similar to the magnetic overlays 28 and 29 shown in FIGS. 18–19.

What is claimed is:

1. A current detector utilizing the Hall-effect for detection or measurement of electric current, comprising:
   (a) a first current-path conductor comprising a pair of terminal webs and a bridge joining the pair of terminal webs;
   (b) a second current-path conductor comprising a pair of terminal webs and a bridge joining the pair of terminal webs;
   (c) the first and the second current-path conductor being so arranged relative to each other that the bridges thereof are superposed one upon the other with a spacing therebetween;
   (d) a Hall generator disposed in the spacing between the bridges of the first and the second current-path conductor in order to be acted upon by magnetic fields that are created upon current flow through the bridges; and
   (e) a coupling conductor interconnecting a preselected one of the terminal webs of the first current-path conductor and a preselected one of the terminal webs of the second current-path conductor so that magnetic lines of force due to current flow through the bridges of the first and the second current-path conductor act in the same direction on the Hall generator.

2. The current detector of claim 1 wherein the bridges of the first and the second current-path conductor are each arcuate in shape.

3. The current detector of claim 2 wherein the first and the second current-path conductor are disposed in two parallel planes, and wherein, as seen in a direction normal to the planes of the current-path conductors, the bridge of each current-path conductor surrounds not less than half of a periphery of the Hall generator.

4. The current detector of claim 1 further comprising a casing of electrically insulating material enveloping at least parts of the first and the second current-path conductor and the Hall generator and holding the same in prescribed relative positions.

5. The current detector of claim 1 further comprising a magnetic overlay covering at least part of at least either of the first and the second current-path conductor in order to keep the magnetic lines of force from dispersion.

6. A current detector utilizing the Hall-effect for detection or measurement of electric current, comprising:
   (a) a first current-path conductor of sheet-metal material integrally comprising a pair of terminal webs which are aligned with each other, and a bridge of substantially arcuate shape joining the pair of terminal webs, the bridge projecting laterally of the pair of aligned terminal webs and being constricted to cause concentrated current flow therethrough;
   (b) a second current-path conductor of sheet-metal material integrally comprising a pair of terminal webs which are aligned with each other, and a bridge of substantially arcuate shape joining the pair of terminal webs, the bridge of the second current-path conductor projecting laterally of the pair of aligned terminal webs thereof and being constricted to cause concentrated current flow therethrough;
   (c) the first and the second current-path conductor being arranged in two parallel planes, with at least the bridges thereof superposed one upon the other with a spacing therebetween;
   (d) a Hall generator disposed in the spacing between the bridges of the first and the second current-path conductor and so positioned relative to the bridges as to be thereby surrounded, as seen in a direction normal to the planes of the current-path conductors, in order to be acted upon by magnetic fields that are created upon current flow through the bridges; and
   (e) a coupling conductor interconnecting a preselected one of the terminal webs of the first current-path conductor and a preselected one of the terminal webs of the second current-path conductor so that magnetic lines of force due to current flow through the bridges of the first and the second current-path conductor act in the same direction on the Hall generator.

7. The current detector of claim 6 wherein the pairs of aligned terminal webs of the first and the second current-path conductor are disposed side by side, as seen in a direction normal to the planes of the current-path conductors, and wherein the bridges of the first and the second current-path conductor extend toward each other into overlapping relationship.

8. The current detector of claim 6 wherein the pairs of aligned terminal webs of the first and the second current-path conductor are disposed at right angles, as seen in a direction normal to the planes of the current-path conductors, with one of the terminal webs of the first current-path conductor overlapping one of the terminal webs of the second current-path conductor, and wherein the bridges of the first and the second current-path conductor extend into overlapping relationship with each other.

9. The current detector of claim 6 wherein the first and the second current-path conductor are disposed in superposition, with the bridges thereof extending in the same direction from the associated pairs of terminal webs in overlapping relationship to each other.

10. The current detector of claim 6 further comprising a casing of electrically insulating material enveloping at least parts of the first and the second current-path conductor and the Hall generator and holding the same in prescribed relative positions.

11. The current detector of claim 6 further comprising a magnetic overlay covering at least part of at least either of the first and the second current-path conductor in order to keep the magnetic lines of force from dispersion.

* * * * *